(12) United States Patent
Jevtic et al.

(10) Patent No.: US 6,727,701 B1
(45) Date of Patent: Apr. 27, 2004

(54) LOOP MRI COIL WITH IMPROVED HOMOGENEITY

(75) Inventors: Jovan Jevtic, West Allis, WI (US); Derek Seeber, Wauwatosa, WI (US); Ashok Menon, Milwaukee, WI (US)

(73) Assignee: IGC Medical Advances, Inc., Milwaukee, WI (US)

( * ) Notice: Subject to any disclaimer, the term of this patent is extended or adjusted under 35 U.S.C. 154(b) by 0 days.

(21) Appl. No.: 10/382,613

(22) Filed: Mar. 5, 2003

(51) Int. Cl.⁷ .................................................. G01V 3/00
(52) U.S. Cl. ........................ 324/318; 324/322; 600/422
(58) Field of Search ................... 324/318, 322, 324/300, 307, 309, 306, 312, 314; 600/422, 421

(56) References Cited

U.S. PATENT DOCUMENTS

| 4,746,866 A | * | 5/1988 | Roschmann | 324/318 |
| 4,797,617 A | * | 1/1989 | Misic et al. | 324/322 |
| 5,049,821 A | * | 9/1991 | Duensing et al. | 324/322 |
| 5,757,189 A | * | 5/1998 | Molyneaux et al. | 324/318 |

* cited by examiner

Primary Examiner—Louis M. Arana
(74) Attorney, Agent, or Firm—Quarles & Brady LLP

(57) ABSTRACT

A local coil for magnetic resonance imaging employs a loop divided by a shunting conductor which reduces sensitivity and field strength at one end of the loop to provide improved homogeneity for different coil configurations.

22 Claims, 2 Drawing Sheets

LOOP MRI COIL WITH IMPROVED HOMOGENEITY

CROSS-REFERENCE TO RELATED APPLICATIONS

STATEMENT REGARDING FEDERALLY SPONSORED RESEARCH OR DEVELOPMENT

BACKGROUND OF THE INVENTION

The present invention relates to magnetic resonance imaging (MRI) and in particular local coils for use in transmitting radio frequency excitation signals and/or receiving magnetic resonance signals in magnetic resonance imaging.

Magnetic resonance imaging is used to generate medical diagnostic images by measuring faint radio frequency signals (magnetic resonance) emitted by atomic nuclei in tissue (for example, protons) after radio frequency stimulation of the tissue in the presence of a strong magnetic field.

The radio frequency stimulation may be applied, and the resulting magnetic resonance signal detected, using a "local coil" having one or more single turn conductive "loops" serving as antennas. The loops of the local coil are tuned to a narrow band, for example, 64 megahertz for a 1.5 Tesla magnetic field, strength magnetic field, and adapted to be placed near or on the patient to decrease the effects of external electrical noise on the detected magnetic resonance signal. The detected magnetic resonance signal may be conducted through one or more signal cables to the MRI machine for processing.

A local coil may incorporate multiple loops whose signals may be combined prior to being processed by the MRI machine, for example, in a quadrature type coil where perpendicular loops are combined with a 90° phase shift. Alternatively, the signals of the multiple loops may be conducted independently to the MRI machine to provide for the so-called "phased array" detection.

An important characteristic of a local coil is the homogeneity of its field strength, the latter defined as the coil's sensitivity to magnetic resonance signals when operated in a receive mode, and the strength of the coil's transmission of radio frequency excitation signals when operated in the transmit mode. Homogeneity is particularly important for certain MRI procedures such as fat saturation where too much;or too little field strength may detrimentally affect the imaging process.

Field strength is a complex function of the design of the local coil and of the coil's interaction with the patient. Homogeneity is often a compromise with other desirable coil characteristics including signal-to-noise ratio and selection of a coil shape.

BRIEF SUMMARY OF THE INVENTION

The present invention provides a method of adjusting the field strength of different portions of loop by adding a shunting conductor that bypasses some current flow at one end of the loop. The shunt, in contrast to a resistive device, does not degrade the Q (quality factor) of the loop as would decrease the signal-to-noise ratio of the loop. By allowing control of the field strength independent of the coil geometry, the shunt permits field strength homogeneity to be increased or permits greater flexibility in other aspects of the coil design without significant loss of field strength homogeneity.

Specifically then, the present invention provides an MRI coil having a loop conductor split by a shunt conductor to divide a first loop portion from a second loop portion. The loop is tuned to a resonance frequency so that the current flow in the first and second loop portions are different.

It is thus one object of the invention to provide a means for controlling current flows within a loop to tune the field strength over different portions of the loop.

The MRI coil may include a matching network for conducting a signal related to the current flow in the first portion to an MRI machine.

Thus, it is another object of the invention to provide a field strength adjustment mechanism that permits a single tap point on the loop.

The area of the first loop portion may be different from the area of the second loop portion.

It is thus another object of the invention to allow altering the field strength profile of the loop by adjusting placement of the shunt conductor.

The MRI coil may include a patient support positioning the loop with respect to a patient so that the second loop portion is closer to the first loop portion of the loop and the proportion of current flow in the first and second loop portions may be adjusted to equalize the sensitivity of the first and second loop portions with respect to the patient.

Thus it is another object of the invention to provide a method of compensating for changes in field strength caused by variable separation distance between portions of the loop and the patient as may occur in certain desirable coil shapes.

The MRI coil may include multiple loops each split by a shunt conductor as described above.

It is thus another object of the invention to allow multi loop coils to have improved homogeneity using this technique.

The multiple loops may be placed adjacent to each other to form a tubular surface with the shunts parallel to the circumference of the tube, and in one embodiment, the tube may taper inward toward the center of the tube at one end of the tube.

Thus it is another object of the invention to allow construction of dome top tubular local coils with better homogeneity.

These particular objects and advantages may apply to only some embodiments falling within the claims and thus do not define the scope of the invention.

DETAILED DESCRIPTION OF THE PREFERRED EMBODIMENT

Figure 1:
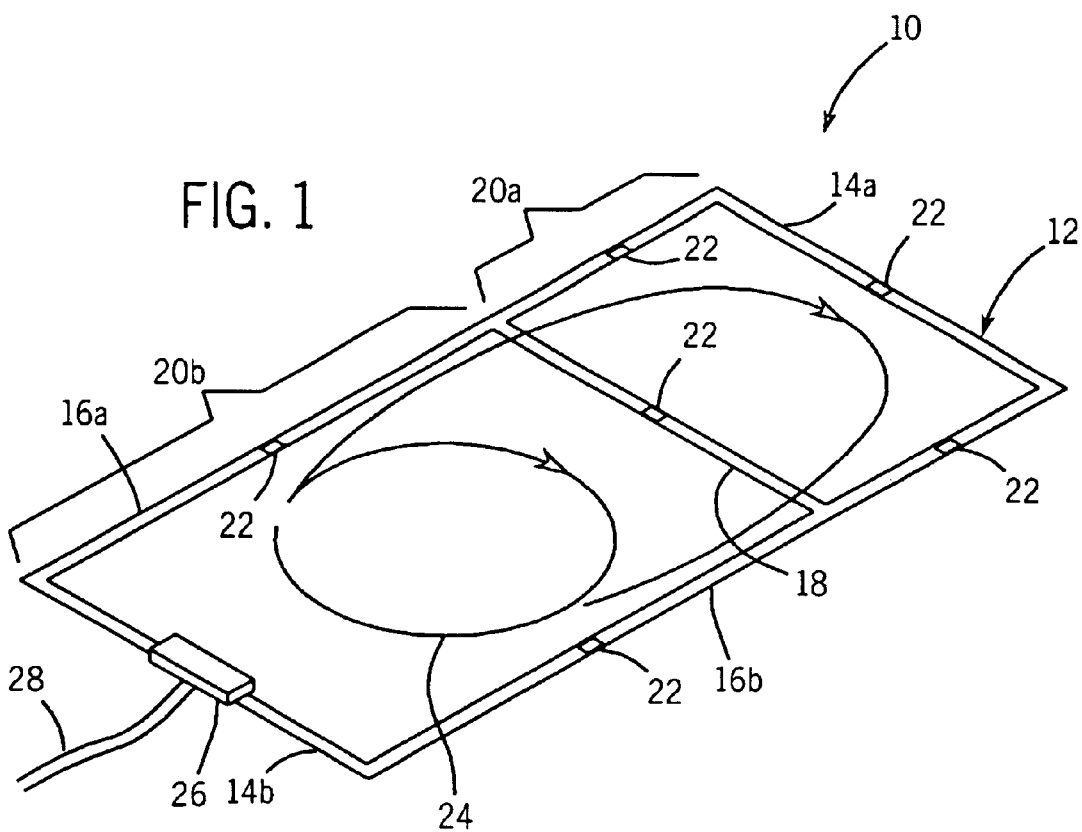
FIG. 1 is a perspective view of a simple loop having a conductive shunt per the present invention, wherein the loop is tuned to provide co-cyclic current flow such as decreases current flow at one end of the loop for reduced field sensitivity at that end.

Referring now to FIG. 1, a local coil 10 for use with an MRI system, provides a series resonant electrical loop 12 and having first and second opposed end conductors 14a and 14b joined by opposed side conductors 16a and 16b. The form of the loop 12 as shown is rectangular, but the invention is not limited to this shape.

A shunt conductor 18 extending between the side conductors 16a and 16b generally parallel to the end conductors 14a and 14b, cuts the loop 12 into two loop portions 20a and 20b, loop portions 20a formed by end conductor 14a and shunt conductor 18 joined by portions of side conductors 16a and 16b and loop portions 20b formed by shunt conductor 18 and end conductor 14b joined by portions of side conductors 16a and 16b. Thus, the shunt conductor 18 is shared between the loop portions 20a and 20b.

A matching network 26 of a type well understood in the art may be connected to the local coil 10 at end conductor 14b to communicate through signal leads 28 to an MRI system (not shown) so that the local coil 10 may receive signals from the MRI system in a transmit mode and detect signals from the patient in a receive mode.

The local coil 10 is tuned into resonance through the use of capacitors 22 placed in series with the distributed inductances of the shunt conductor 18, end conductor 14a and 14b, and side conductors 16a and 16b. The tuning is such as to ensure that the resonant mode of the local coil 10 provides currents in loop portions 20a and 20b are different by a desired amount. Generally, in the case of co-cyclic currents, current 24 passing through loop 20b in either direction splits at the junctures of the shunt conductor 18 and the side conductors 16a and 16b to pass partially through the shunt conductor 18 and partially through end conductor 14a so that the magnitude of the current 24 in loop 20b (being the measure of current in end conductor 14b) equals the magnitude of the current in the shunt conductor 18 summed with the magnitude of the current in the second loop portion 20a (being the measure of the current end conductor 14a). The currents need rot be co-cyclic how ever for different tuning methods.

This splitting of the current 24 means that a radio-frequency (RF) excitation signal introduced into the local coil 10 by matching network 26 attached at end conductor 14b (during an MRI transmit cycle) will provide less current flow (and hence less field strength) at loop 20a than would be the case if the shunt conductor 18 were absent. Likewise during an MRI receive cycle, the magnetic resonance signal received by loop 20a will make a smaller contribution to the signal conducted from matching network 26 than would be the case if the shunt conductor 18 were absent.

Generally, the shunt conductor 18 may be varied in position along the length of side conductors 16a and 16b, with appropriate adjustment in the series capacitors 22, to change the point at which field strength is reduced. Multiple shunt conductors 18 (not shown) may be used to create several loop portions of reduced field strength.

As mentioned above, the loop 12 may operate in either a transmit or receive mode and when operating as a receive only coil 10 may include passive or active de-coupling circuits of a type well known in the art.

Figure 2:
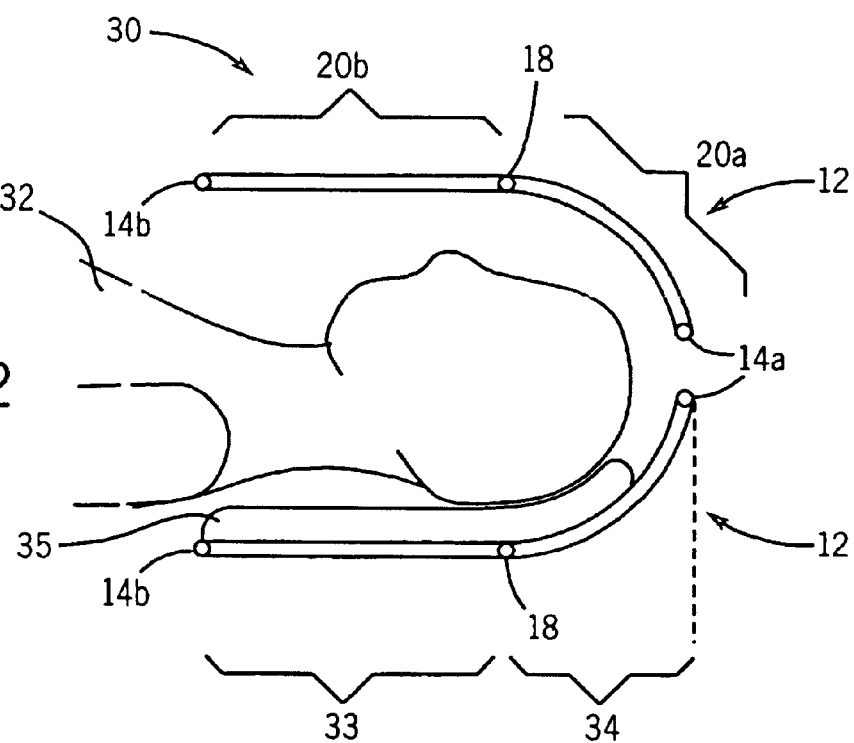
FIG. 2 is a cross sectional view of a head coil constructed of multiple simple loops similar to FIG. 1 showing increased proximity of a superior end of the loops to the patient as would normally produce an undesirable higher field strength which may be reduced by the shunt conductor of the present invention.
Figure 3:
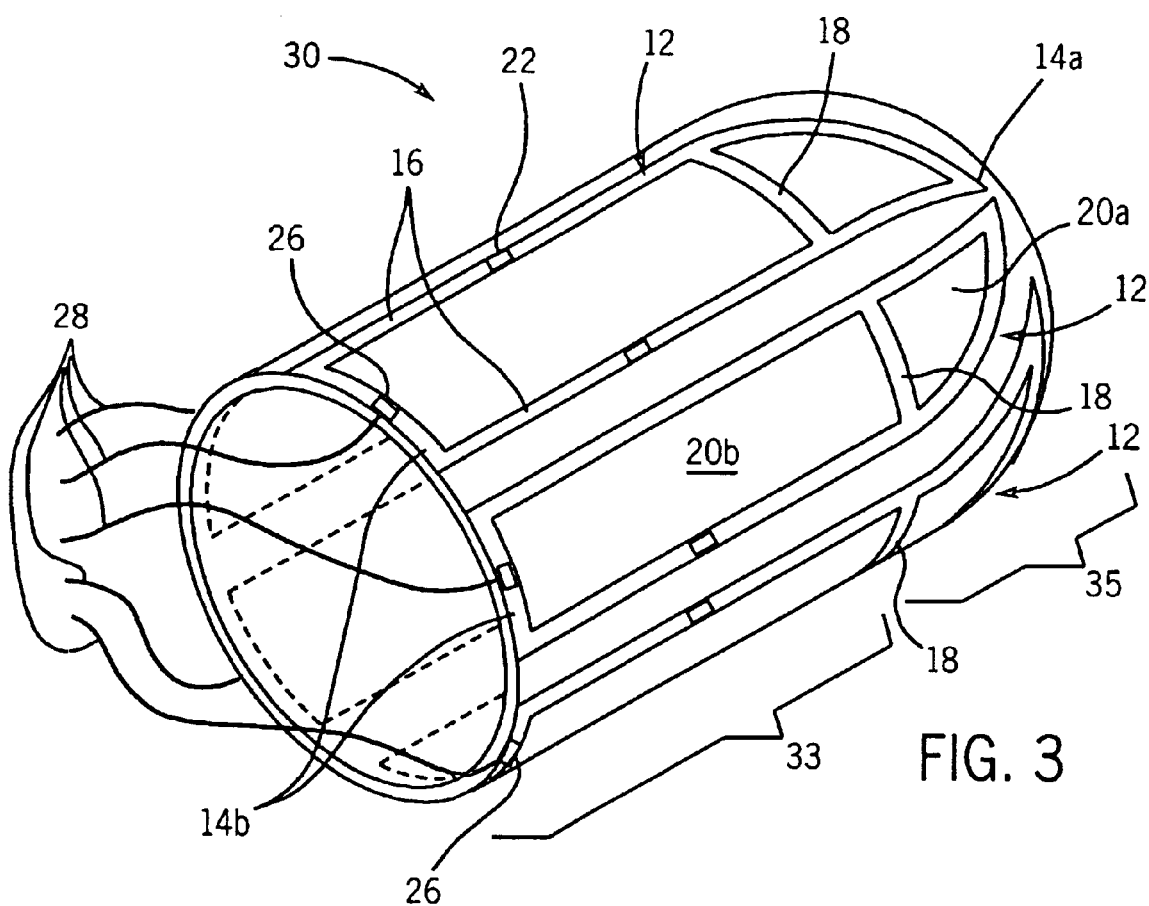
FIG. 3 is a perspective view of the head coil of FIG. 2 showing its domed top.

Referring now to FIGS. 2 and 3, an example application of the present invention provides a domed-top head coil 30 having a cylindrical tubular section 33 capped by a hollow hemispherical domed section 34 at its superior end. The inferior end of the domed-top head coil 30 is open to receive the head of a patient 32. The domed-top head coil 30 may include a patient support pillow 35 providing comfortable support of the patient's head and providing more uniformity in positioning of the patient within the volume of the domed-top head coil 30 so as to also enhance uniformity.

Loops 12, as described above, may be arrayed about the surface of the domed-top head coil 30 so that their side conductors 16 extend generally along the axis of the cylinder and the shunt conductors 18 of each loop 12 are positioned to be circumferential with respect to the cylinder generally at the interface between the cylindrical tubular sections 33 and the hemispherical domed section 34. Conductive ends 14a, in this configuration are eliminated or reduced to extremely short segments so as to provide a tapering inward of the loop 12 as it approaches and covers the hemispherical domed section 34 accommodating the reduced circumference of that surface as one moves to its superior tip.

This tapering inward of the loop portions 20a of the loops 12 would normally be expected to cause increased field strength of loop portions 20a both because of their closer proximity to the patient 32 and because of their inward angulations. This increased field strength is offset, however, by the shunt conductor 18 which decreases the signal contributions to and by loop 20a as described above.

Each of the loops 12 in the domed-top head coil 30 may be separately connected by signal leads 28 and matching networks 26 to the MRI machine in a phased array mode of operation. Alternatively, each of the signal leads 28 may be joined to a combiner network properly phase shifting and adding these signals to produce one or more combination signals provided to the MRI machine. The signal leads 28 may be joined to follow along a grounding ring as taught in the U.S. patent application Ser. No. 10/227,072 filed Aug. 22, 2002, assigned to the assignee of the present invention and hereby incorporated by reference.

Figure 4:
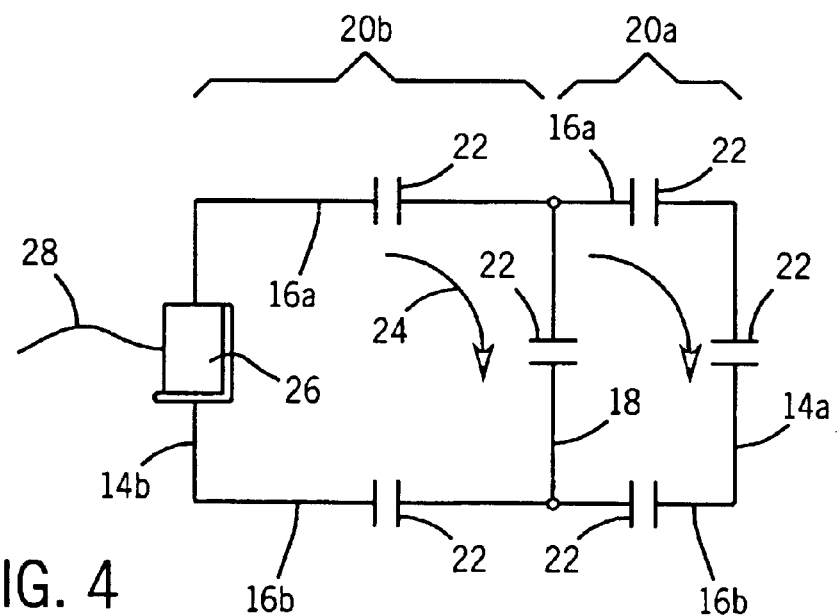
FIG. 4 is a simplified, schematic of the coil of FIG. 1 and of individual coils of FIGS. 2 and 3 showing the use of series capacitors for tuning the coil to resonance

Referring now to FIG. 4 in the embodiment of the domed-top head coil 30, the shunt conductor 18 may be placed so as to create a ratio of areas between loop portion 20b and 20b of 2:1. In this situation, a current splitting through shunt conductor 18 versus end conductor 14a of approximately 1 to 0.6 as found suitable. Other ratios may also be appropriate for different configurations of coils other than that of FIG. 2 as will be understood to those of ordinary skill in the art. For example, the location of the shunt may be such as to divide the area of the first and second loop in a ratio substantially in the range 1.5:1 to 3:1. Alternatively, the location of the shunt may be such as to divide the current flow between the first and second loop in a ratio of substantially in a range of 1:0.5 to 1:0.7.

It will be understood that the loops 12 may offer similar benefits in structures other than the domed-top head coil 30 but where portions of the patient anatomy may be closer or better received by portions of the loop or where the loop geometry would normally adversely affect field strength homogeneity in other ways.

It is specifically intended that the present invention not be limited to the embodiments and illustrations contained herein, but include modified forms of those embodiments including portions of the embodiments and combinations of elements of different embodiments as come within the scope of the following claims.

We claim:

1. An MRI coil having a loop conductor split by a shunt conductor to divide a first loop portion from a second loop portion;

wherein the loop conductor is tuned to a resonant frequency and wherein current flow at the resonant frequency within the loop conductor divides so that the current flow in the first loop portion and the current flow in the second loop portion are unequal.

2. The MRI coil of claim 1 further including a matching network for producing a signal related to the current flow in the first loop portion for transmission to an MRI machine.

3. The MRI coil of claim 1 wherein the area of the first loop portion is different from the area of the second loop portion.

4. The MRI coil of claim 1 wherein the MRI coil includes a patient support positioning the MRI coil with respect to a patient so that the second loop portion is closer to the patient than the first loop portion and wherein a proportion of current flow, between the first and second loop portions is adjusted to equalize the sensitivities of the first and second loop portions with respect to the patient.

5. The MRI coil of claim 1 wherein the MRI coil includes multiple loops, each split by a shunt conductor to divide each loop into a first loop portion and a second loop portion, wherein each loop is tuned to a resonant frequency and wherein current flow current flow at the resonant frequency within each loop divides so that the current flow in the first loop portion and the current flow in the second loop portion are unequal.

6. The MRI coil of claim 5 wherein each loop includes a matching network and conductor to independently transmit a signal related to the current in its respective first loop portion to signal processing circuitry of the MRI machine.

7. The MRI coil of claim 5 further including a combining network and wherein each loop includes a matching network and conductors to independently transmit a signal to the combining network which provides a signal-to-signal processing circuitry of the MRI machine.

8. The MRI coil of claim 5 wherein the multiple loops are positioned adjacent to each other to define a tubular surface with the shunts parallel to a circumference of the tubular surface.

9. The MRI coil of claim 8 wherein the tubular surface tapers inward toward a center of the tubular surface at one end of the tubular surface to form a dome.

10. The MRI coil of claim 1 wherein the loop includes a decoupling circuitry decoupling the loop form radio frequencies transmitted by the MRI machine.

11. The MRI coil of claim 1 wherein the location of the shunt is such as to divide the area of the first and second loop portions in a ratio of substantially in a range of 1.5:1 to 3:1.

12. The MRI coil of claim 1 wherein the location of the shunt is such as to divide the current flow of the first and second loop portions in a ratio of substantially in a range of 1:.5 to 1:.7.

13. The MRI coil of claim 1 wherein the loop conductor is split by multiple shunt conductor to divide a first loop portion from multiple second loop portions, wherein current flow at the resonant frequency within the loop conductor divides so that the current flow in the first loop portion and the multiple second loop portion are unequal.

14. A method of detecting MRI signals in a patient comprising the steps of:

a) locating a loop conductor near the patient, the loop conductor split by a shunt conductor to divide a first loop portion from a second loop portion, and b) tuning the loop conductor so that at a resonant frequency, current flow within the first loop divides so that the current flow in the first loop portion and the current flow in the second loop portion are unequal.

15. The method of claim 14 further including the step of transmitting a signal from the first loop portion to an MRI machine.

16. The method of claim 14 wherein the area of the first loop portion is different from the area of the second loop portion.

17. The method of claim 14 including the step of positioning a patient on a patient support of the MRI coil so that the second loop portion is closer to the patient than the first loop portion and wherein a proportion of current flow between the first and the second loop portions, is adjusted to equalize the sensitivities of the first and second loop portions with respect to the patient.

18. The method of claim 14 wherein the MRI coil includes multiple loops, each split by a shunt conductor to divide each loop into a first loop portion and a second loop portion, wherein each loop is tuned so that current flow at the resonant frequency within the multiple loops divides so that the current flow in the first loop portion and the current flow in the second loop portion are unequal.

19. The method of claim 18 including the step of transmitting a signal related to the current in each respective first loop portion to signal processing circuitry of the MRI machine.

20. The method of claim 18 further including the step of transmitting a signal related to the combination of the current in each respective first loop portion to signal processing circuitry of the MRI machine.

21. The method of claim 18 wherein the multiple loops are positioned adjacent to each other to define a tubular surface with the shunts parallel to a circumference of the tubular surface.

22. The MRI coil of claim 19 including the steps of transmitting a radio frequency excitation signal through the loop into a patient and subsequently detecting an NMR signal from the patient with the loop.

\* \* \* \* \*